United States Patent
Fukushi et al.

(10) Patent No.: US 11,710,511 B2
(45) Date of Patent: Jul. 25, 2023

(54) SEMICONDUCTOR DEVICE HAVING A HIGH-SPEED MEMORY WITH STABLE OPERATION

(71) Applicant: RENESAS ELECTRONICS CORPORATION, Tokyo (JP)

(72) Inventors: Tetsuo Fukushi, Tokyo (JP); Hiroyuki Takahashi, Tokyo (JP); Muneaki Matsushige, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 17/501,411

(22) Filed: Oct. 14, 2021

(65) Prior Publication Data
US 2022/0130434 A1 Apr. 28, 2022

(30) Foreign Application Priority Data
Oct. 23, 2020 (JP) .................................. 2020-177830

(51) Int. Cl.
*G11C 5/14* (2006.01)
*G11C 5/02* (2006.01)

(52) U.S. Cl.
CPC .............. *G11C 5/148* (2013.01); *G11C 5/025* (2013.01)

(58) Field of Classification Search
CPC ..... G11C 5/148; G11C 5/025; G11C 11/4074; G11C 11/4091; G11C 7/065; G11C 7/06; G11C 2207/065
See application file for complete search history.

(56) References Cited

U.S. PATENT DOCUMENTS

| 7,864,608 B2 | 1/2011 | Takahashi |
| 2007/0097769 A1 | 5/2007 | Tsukada |
| 2009/0122630 A1 * | 5/2009 | Takahashi ............... G11C 7/08 365/207 |

FOREIGN PATENT DOCUMENTS

| JP | 11-121717 A | 4/1999 |
| JP | 2008-299893 A | 12/2008 |

OTHER PUBLICATIONS

Extended European Search Report issued in corresponding European Patent Application No. 21203908.5-1203, dated Mar. 3, 2022.

* cited by examiner

*Primary Examiner* — Sultana Begum
(74) *Attorney, Agent, or Firm* — McDermott Will & Emery LLP

(57) ABSTRACT

A semiconductor device includes a memory mat having: a plurality of memory cells; a sense amplifier connected to a memory cell selected from the plurality of memory cells; a first power supply wiring; a first switch connected between the sense amplifier and the first power supply wiring and made an ON state in operating the sense amplifier; and a second switch connected to the sense amplifier and made an ON state in operating the sense amplifier, a second power supply wiring arranged outside the memory mat and connected to the first power supply wiring, a third power supply wiring arranged outside the memory mat and connected to the sense amplifier via the second switch, and a short switch arranged outside the memory mat and connected between the second and third power supply wirings. Here, in operating the sense amplifier, the short switch is made an ON state.

9 Claims, 11 Drawing Sheets

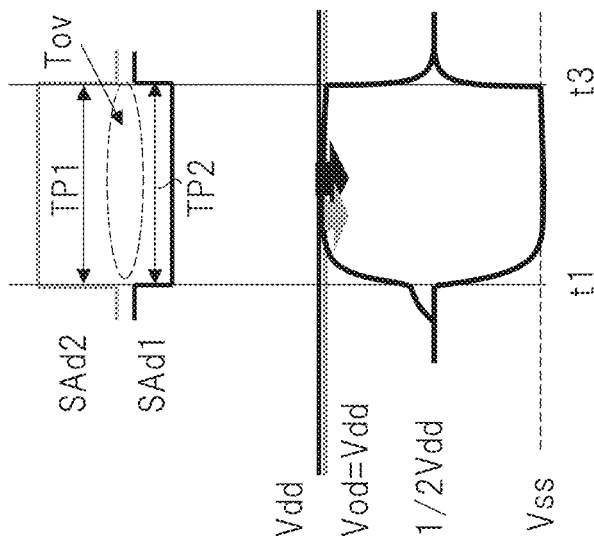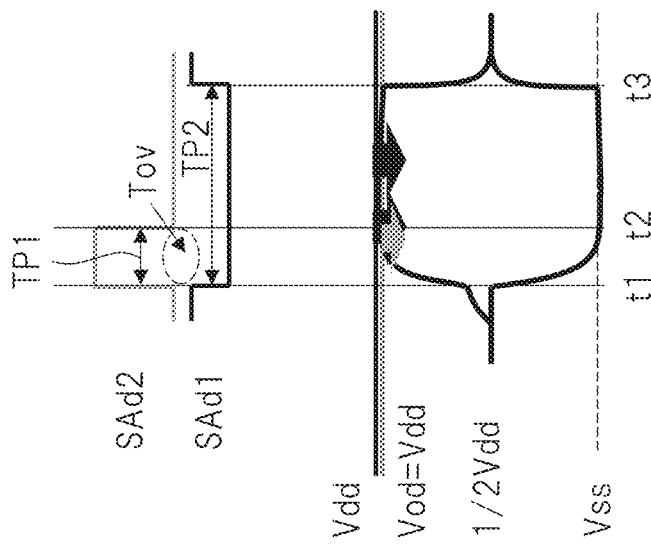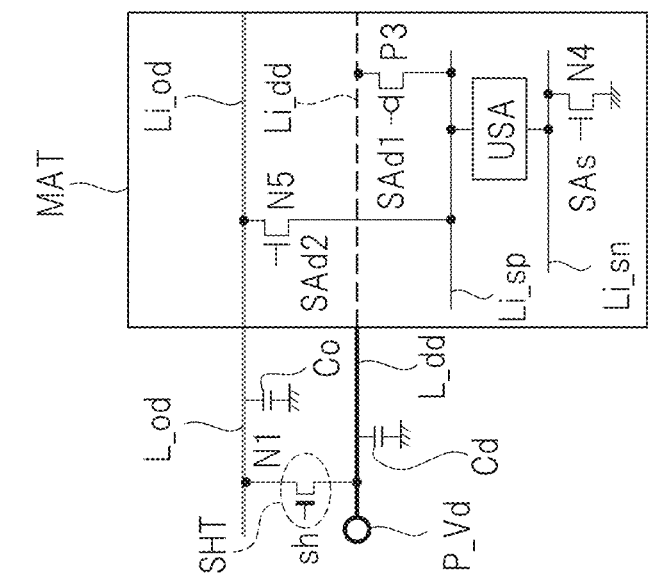

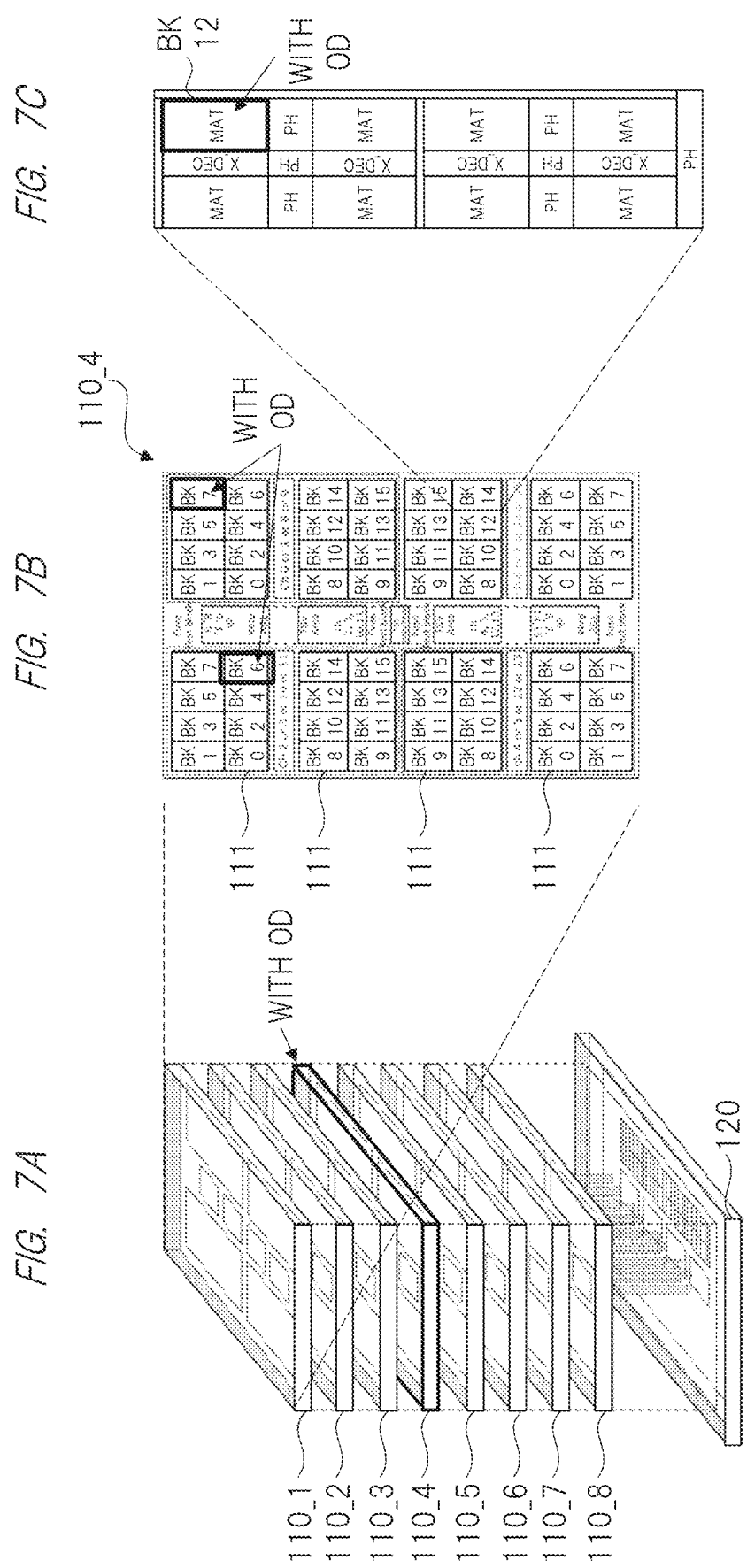

SEMICONDUCTOR DEVICE HAVING A HIGH-SPEED MEMORY WITH STABLE OPERATION

CROSS-REFERENCE TO RELATED APPLICATIONS

The present application claims priority from Japanese Patent Application No. 2020-177830 filed on Oct. 23, 2020, the content of which is hereby incorporated by reference to this application.

BACKGROUND

The present invention relates to a semiconductor device, for example, a semiconductor device including a memory.

The memory included in the semiconductor device includes, for example, a dynamic type memory and a static type memory.

There are disclosed techniques listed below.
[Patent Document 1] Japanese Unexamined Patent Application Publication No. 2008-299893

SUMMARY

Speed of semiconductor devices is increasing, and power supply voltages are becoming lower. When a sense amplifier in a memory is driven by a single power supply voltage, the sense amplifier may become inoperable if an operation margin of the sense amplifier is small. In order to increase the operation margin of the sense amplifier, there is an OD method as shown in Patent Document 1.

In the OD method, the sense amplifier is driven by using two types of power supply voltages with different voltage values. That is, in an initial period (sense initial stage) when the sense amplifier starts operating, the sense amplifier is driven by the power supply voltage having a high voltage value and the sense amplifier is then driven by the power supply voltage having a low voltage value. This makes it possible to increase the operation margin of the sense amplifier in the initial period. However, in the initial period, a relatively large drive current flows through the sense amplifier from the power supply voltage having a high voltage value, so that power consumption (power) results in increasing.

The present inventors have considered applying the OD method to a sense amplifier having a small operation margin and not applying the OD method to a sense amplifier having a large operation margin. The operation margin of the sense amplifier determines (limits) an operation margin of the semiconductor device, and varies depending on, for example, process variations and/or element variations in manufacturing the semiconductor device. FIG. 12 is a view showing process variations of a semiconductor device. In FIG. 12, Fast (high speed), Typ (standard), and Slow (low speed) indicate speed of elements configuring the semiconductor device, for example, speed of a field effect transistor (hereinafter, also referred to as MOSFET). By the variations in the process, the speed of the MOSFET also varies as shown in FIG. 12.

The operation margin of the sense amplifier becomes small as the speed of the element(s) decreases, and becomes large as the speed of the element increases. By applying the OD method (with OD) when the operation margin is small, that is, at low speed, the power consumption increases, but this makes it possible to prevent the semiconductor device from becoming inoperable. Further, when the operation margin is large, that is, at standard and high speed, applying no OD method (without OD) makes it possible to reduce the power consumption.

However, studies by the present inventors have found that the sense amplifier may not operate stably when the OD method is not applied. Taking FIG. 5 of Patent Document 1 as an example, when the OD method is not applied, a MOSFET (Tr6) is made an OFF state in an initial period. At this time, when driving capability of a MOSFET (Tr5) that drives the sense amplifier is insufficient, when a power supply wiring network that supplies a power supply voltage to the sense amplifier via the MOSFET (Tr5) is weak, or when timing of causing the MOSFET (Tr5) to operate is inappropriate, it becomes difficult to cause the sense amplifier to operate stably at high speed.

A semiconductor device according to one embodiment described in the present specification will be described as follows.

That is, the semiconductor device includes a memory mat having: a plurality of memory cells; a sense amplifier connected the memory cell selected from the plurality of memory cells; a first power supply wiring; a first switch connected between the sense amplifier and the first power supply wiring and made an ON state when the sense amplifier is caused to operate; and a second switch connected to the sense amplifier and made an ON state when the sense amplifier is caused to operate, a second power supply wiring arranged outside the memory mat and connected to the first power supply wiring, a third power supply wiring arranged outside the memory mat and connected to the sense amplifier via the second switch, and a third switch arranged outside the memory mat and connected between the second power supply wiring and the third power supply wiring. Here, when the sense amplifier is caused to operate, the third switch is made an ON state.

The other objects and novel characteristics of the present invention will be apparent from the description of the present specification and the accompanying drawings.

According to one embodiment, provided can be a semiconductor device having a memory capable of stable operation at high speed.

BRIEF DESCRIPTION OF THE DRAWINGS

FIG. 6A is a diagram for explaining an operation of a sense amplifier according to a third embodiment.

FIG. 6B is a diagram for explaining an operation of a sense amplifier according to the third embodiment.

FIG. 6C is a diagram for explaining an operation of a sense amplifier according to the third embodiment.

FIG. 7A is a diagram for explaining a semiconductor device according to a fourth embodiment.

FIG. 7B is a diagram for explaining a semiconductor device according to the fourth embodiment.

FIG. 7C is a diagram for explaining a semiconductor device according to the fourth embodiment.

DETAILED DESCRIPTION

Figure 1:
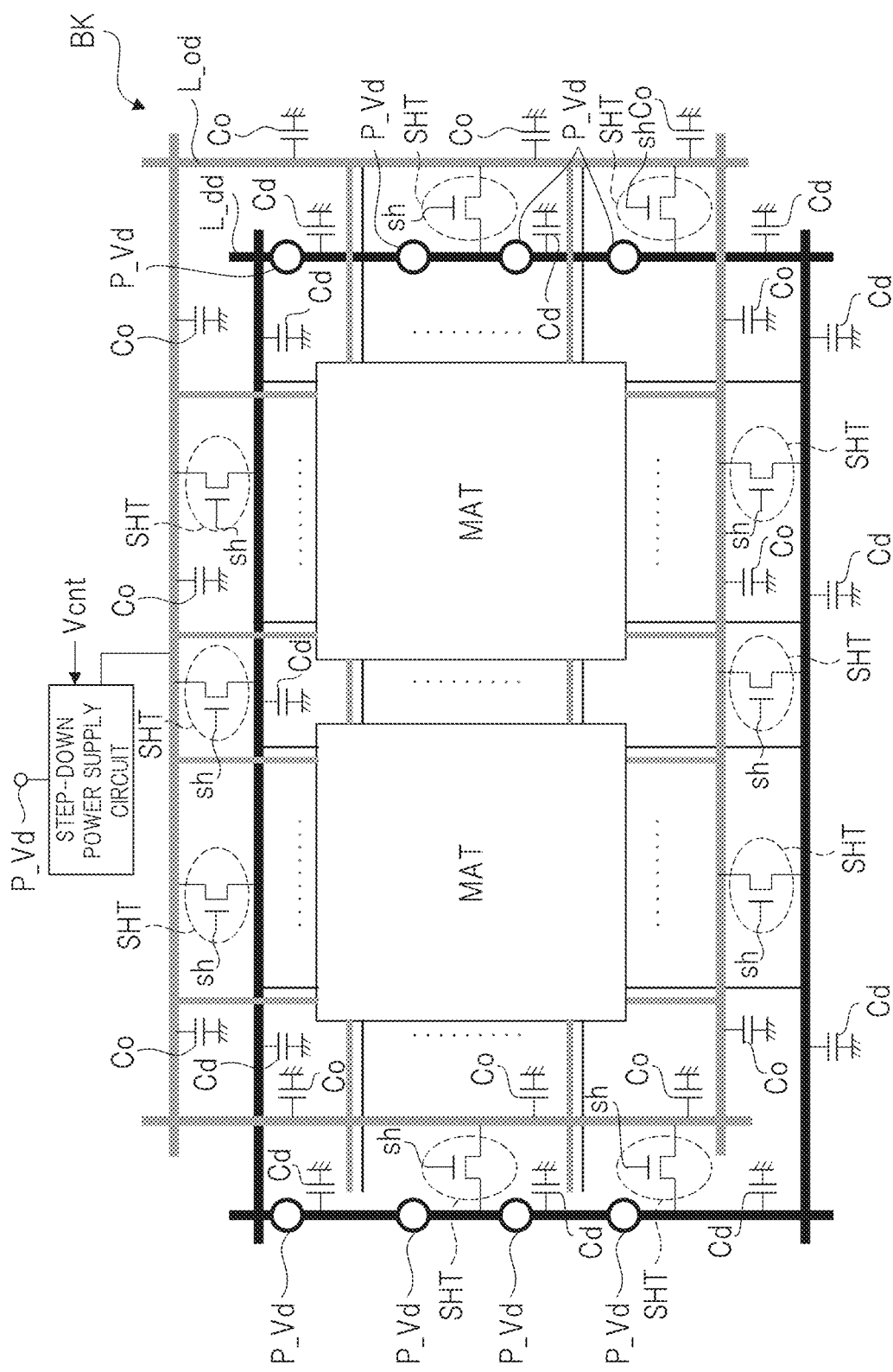
FIG. 1 is a view showing a configuration of a memory bank according to a first embodiment.

Hereinafter, respective embodiments of the present invention will be described with reference to the drawings. Incidentally, disclosure is merely an example, and a matter at which those skilled in the art can easily arrive by appropriate changes while maintaining the gist of the invention is naturally included in the scope of the present invention.

Further, in the present specification and respective figures, the same elements as those having been described above in the figures may be denoted by the same reference numerals, and a detailed description thereof may be omitted appropriately.

First Embodiment

Hereinafter, an embodiment will be described by taking, as an example, a semiconductor device suitable for learning and inference applications executed to realize AI (Artificial Intelligence). Of course, the present invention is not limited to a semiconductor device for such applications.

<Configuration of Semiconductor Device>

A semiconductor device for learning and inference applications is required to mount a neural network such as a large-scale product-sum calculation circuit and to process a large amount of data in real time. Further, a memory is mounted on such a semiconductor device. The mounted memory is used to store and update a large amount of analytical data (e.g., image data) generated by a real-time processing. In addition, the mounted memory is used to store and update, at high speed, intermediate feature data and weight data generated by the neural network. In order to need to perform save and update at high speed, a wide band and a large capacity memory is required as the mounted memory. Further, in order to reduce heat generation and the like, the mounted memory is also required to have low power consumption.

Figure 8:
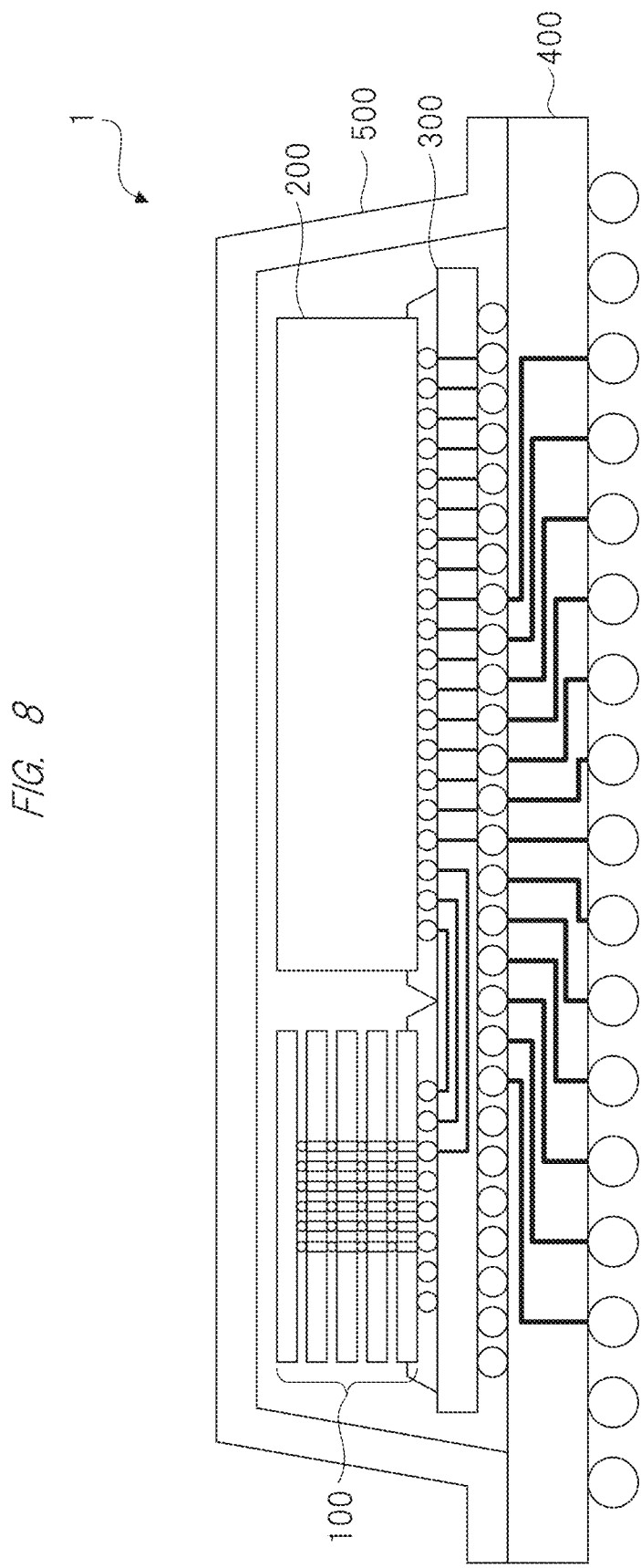
FIG. 8 is a schematic cross-sectional view showing a configuration of a semiconductor device according to the first embodiment.

FIG. 8 is a schematic cross-sectional view showing a configuration of the semiconductor device according to the first embodiment. In the figure, the reference numeral "1" denotes a semiconductor device according to the first embodiment. The semiconductor device 1 is configured by a plurality of semiconductor chips so as to have a configuration suitable for applications such as learning. Only the semiconductor chips necessary for explanation among the plurality of semiconductor chips are drawn in FIG. 8. That is, in FIG. 8, the reference numeral "200" denotes a semiconductor chip for a data processing provided with a large-scale product-sum calculation circuit or the like in order to process a large amount of data. Further, in the figure, the reference numeral "100" denotes a stacked memory composed of semiconductor chips for a plurality of memories (hereinafter, also referred to as memory chips).

The data-processing semiconductor chip 200 and the stacked memory 100 are connected to a substrate 300 by a plurality of bumps, and the substrate 300 is connected to a package substrate 400 by a plurality of bumps. The stacked memory 100, the semiconductor chip 200, and the substrate 300 are covered and sealed by a sealing package 500. As shown in FIG. 8, some electrodes of the stacked memory 100 are connected to some electrodes of the data-processing semiconductor chip 200 by wirings formed in the substrate 300. Further, some electrodes of the stacked memory 100 and the data-processing semiconductor chip 200 are connected to the bumps provided on the package substrate 400.

By connecting the electrodes of the data-processing semiconductor chip 200 and the electrodes of the stacked memory 100, for example, data (intermediate feature data etc.) generated by the data-processing semiconductor chip 200 is supplied to the stacked memory 100, and is saved and updated in the stacked memory 100.

<<Configuration of Stacked Memory>>

Figure 9:
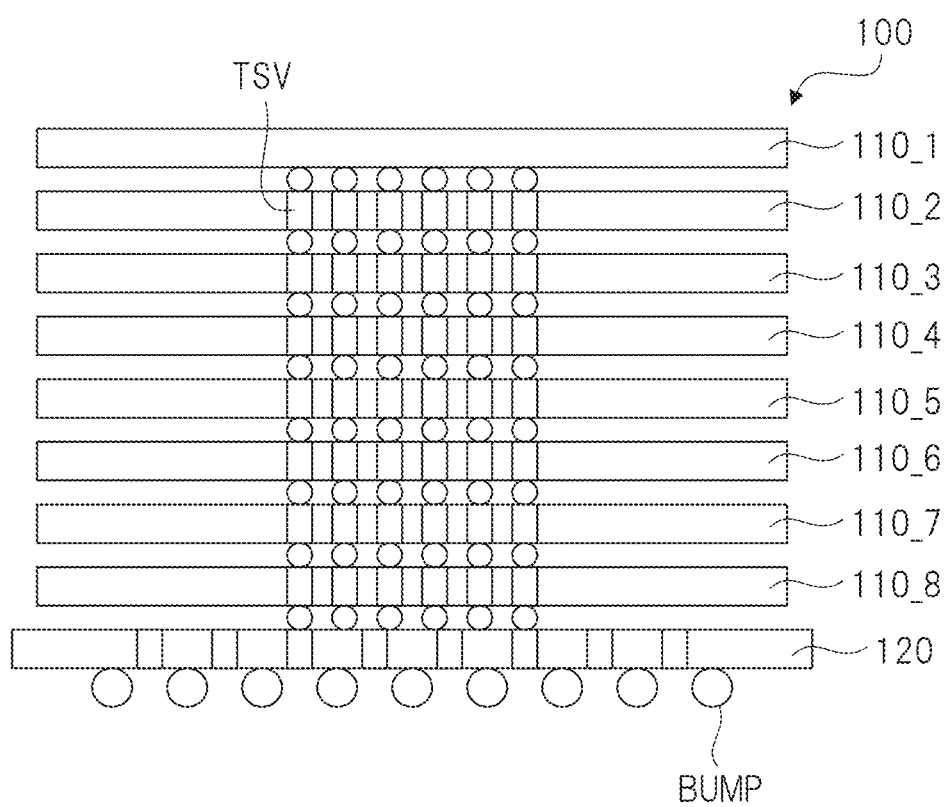
FIG. 9 is a cross-sectional view schematically showing a configuration of a stacked memory according to the first embodiment.

Next, a configuration of the stacked memory 100 will be described. FIG. 9 is a cross-sectional view schematically showing a configuration of the stacked memory according to the first embodiment.

In FIG. 9, the reference numerals "110_1" to "110_8" denotes a memory chip, and "120" denotes a semiconductor chip for a base (hereinafter, also referred to as a base chip). As shown in FIG. 9, memory chips 110_1 to 110_8 are laminated on and over a base chip 120. The memory chips 110_1 to 110_8 and the base chip 120 are connected by a TSV (Through Silicon Via) connection technique. That is, through holes are formed in each of the stacked memory chips 110_1 to 110_8, and the different memory chips are electrically connected to each other by a conductive material, and are further connected to the base chip 120.

Bumps are formed on the base chip 120, and the stacked memory 100 is connected to the substrate 300 by the bumps. Incidentally, various circuits are formed also on the base chip 120.

Use of the stacked memory 100 having such a configuration makes it possible to connect many memory chips 110_1 to 110_8 to the data-processing semiconductor chip 200. That is, the semiconductor chip 200 can use a wide band memory. In this case, power consumption required for data transfer between the semiconductor chip 200 and the memory chip can be suppressed since the TSV technology is used. Therefore, power consumed in the memory chip leads to limiting power consumption of the stacked memory 100. In other words, a reduction of the power consumption in the memory chip becomes very effective in reducing the power consumption of the stacked memory 100.

Figure 10:
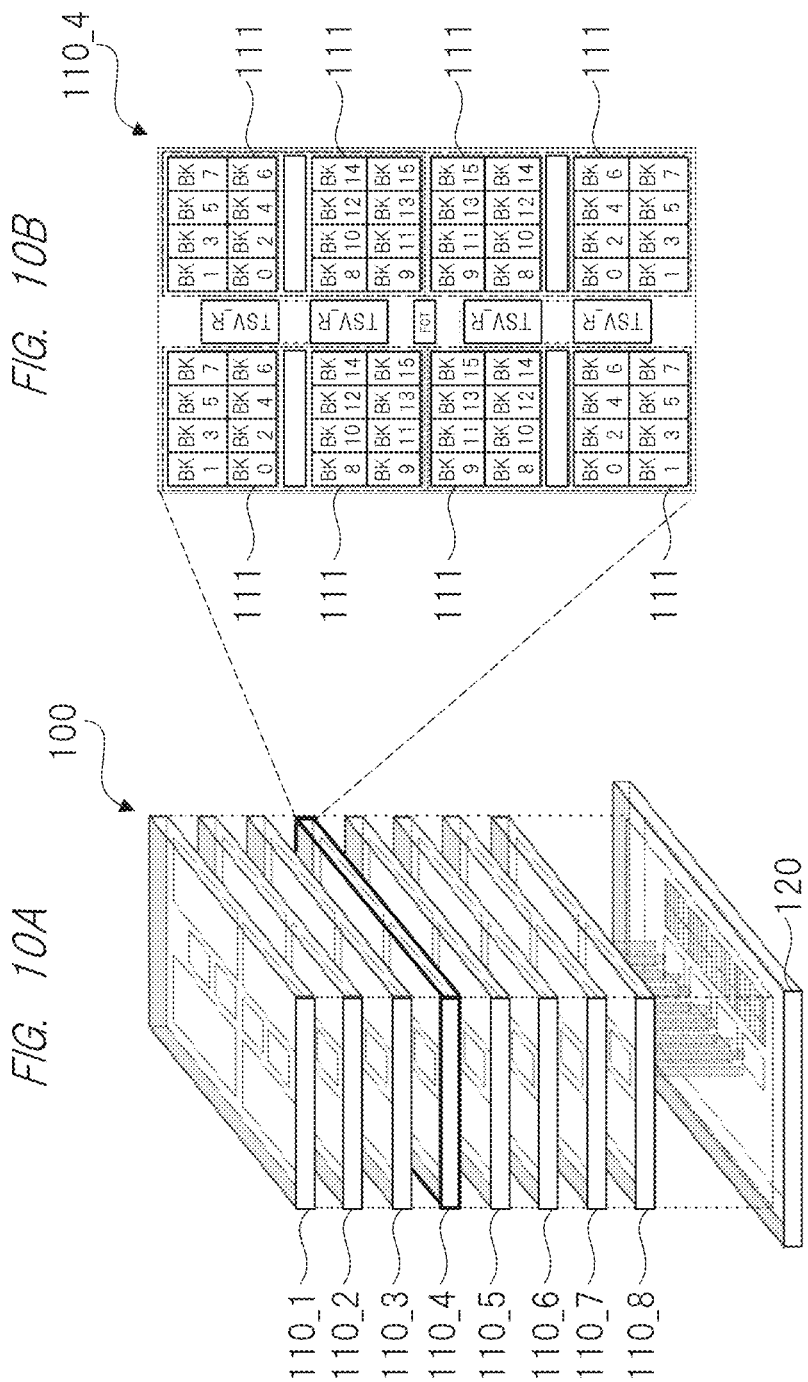
FIG. 10A is a diagram for explaining the stacked memory according to the first embodiment.
FIG. 10B is a diagram for explaining the stacked memory according to the first embodiment.

FIG. 10 is a diagram for explaining the stacked memory according to the first embodiment. FIG. 10 shows a relationship between the stacked memory 100 and the memory chip. In FIG. 10A, the configuration of the stacked memory 100 is schematically shown through a perspective view similarly to FIG. 9. Although being not particularly limited, the memory chips 110_1 to 110_8 configuring the stacked memory 100 have similar configurations to each other. Therefore, here, the memory chip 110_4 will be described as a representative. In FIG. 10B, the configuration of the memory chip 110_4 is schematically shown through a plan view.

In FIG. 10B, the reference numeral "111" denotes a memory unit composed of a plurality of memory banks. Although being not particularly limited, a memory unit 111 in the first embodiment is composed of eight memory banks BK0 to BK7 (BK8 to BK15), and eight memory units are arranged on one memory chip 110_4. In the memory chip 110_4, a TSV region TSV_R connected by a TSV connection technique and a control region FCT provided with a fuse are arranged in a central portion (center row) sandwiched between the four memory units 111. The memory banks BK0 to BK15 will be described later with reference to FIG. 1, and a plurality of memory mats including a plurality of memory cells, a sense amplifier, and the like are arranged.

<<Configuration of Memory Bank>>

FIG. 1 is a view showing a configuration of a memory bank according to the first embodiment. Since the memory banks BK0 to BK15 mutually have the same configuration, the memory banks BK0 to BK15 will be collectively referred to as a memory bank BK, which will be described below.

The memory bank BK is not particularly limited, but includes a plurality of memory mats MAT arranged in a matrix and a power supply wiring arranged in a mesh shape outside the plurality of memory mats MAT to supply a power supply voltage to the memory mats MAT. In the first embodiment, although being not particularly limited, three types of power supply wirings are arranged in a mesh shape. That is, a first power supply wiring (hereinafter referred to as the ground power supply wiring) that supplies a ground voltage Vss to the memory mat MAT, a second power supply wiring that supplies a first power supply voltage Vdd to the memory mat MAT, and a third power supply wiring that supplies a second power supply voltage Vod to the memory mat MAT are arranged in a mesh shape outside the plurality of memory mats MAT. In FIG. 1, the ground power supply wiring among the three types of power supply wirings is omitted, the second power supply wiring is indicated by the reference numeral "L_dd", and the third power supply wiring is indicated by the reference numeral "L_od". Further, in FIG. 1, two of the memory mats MAT arranged in a matrix are illustrated.

In the memory bank BK according to the first embodiment, a plurality of short switches SHT (third switches) are arranged outside the memory mat MAT. In FIG. 1, the short switch SHT is configured by an N-channel type (hereinafter, also referred to as N-type) MOSFET N1, and a source/drain path of the N-type MOSFET N1 is connected in series between the second power supply wiring L_dd and the third power supply wiring L_od. Further, as shown in FIG. 1, the shoot switch SHT is arranged so as to be dispersed outside the memory mat MAT when viewed in a plan view. A short control signal Sh is supplied to a gate of the N-type MOSFET N1. When the short control signal Sh becomes a high level, the N-type MOSFET N1, that is, the short switch SHT becomes a ON state, and the second power supply wiring L_dd and the third power supply wiring L_od are electrically short-circuited. Connection of the second power supply wiring L_dd and the third power supply wiring L_od by the distributed and arranged short switch SHT makes it possible to reduce connection resistance generated at a time of connection.

The memory mat MAT will be described later with reference to FIGS. 2 and 3, and a detailed description thereof will be omitted. However, the memory mat MAT includes: a plurality of memory cells arranged in a matrix; a plurality of sense amplifiers; a word line driver; and three types of power supply wirings arranged in a mesh shape. The three types of power supply wirings arranged in the memory mat MAT are a fourth power supply wiring (Li_ss in FIG. 3) that supplies the ground voltage Vss to the sense amplifier and the like, a fifth power supply wiring (Li_dd in FIG. 3: also referred to as a first power supply wiring) that supplies the first power supply voltage Vdd to the sense amplifier and the like, and a sixth power supply wiring (Li_od in FIG. 3) that supplies the second power supply voltage Vod to the sense amplifier or the like. Here, the fourth power supply wiring (Li_ss) is connected to the above-mentioned ground power supply wiring, the fifth power supply wiring (Li_dd: first power supply wiring) is connected to the above-mentioned second power supply wiring L_dd, and the sixth power supply wiring (Li_od) is connected to the above-mentioned third power supply wiring L_od.

In FIG. 1, the reference numeral "Cd" denotes a parasitic capacitance connected to the second power supply wiring L_dd, and "Co" denotes a parasitic capacitance connected to the third power supply wiring L_od. Further, the reference numeral "P_Vd" denotes a power supply electrode (pad) connected to the second power supply wiring L_dd. For example, the first power supply voltage Vdd is supplied to this pad P_Vd from an outside of the memory chip 110. Consequently, the first power supply voltage Vdd is supplied into each memory mat MAT.

Further, in FIG. 1, the reference numeral "P_Ve" denotes, for example, a power source pad to which a predetermined external voltage is supplied from the outside of the memory chip 110. A voltage value of the external voltage supplied to the pad P_Ve is a voltage having an absolute value higher than that of the first power supply voltage Vdd. This external voltage is supplied to a step-down power supply circuit (voltage conversion circuit) 112. An operation of the step-down power supply circuit 112 is controlled by an operation control signal Vcnt. When a step-down operation is instructed by the operation control signal Vcnt, the external voltage is stepped down and the above-mentioned second power supply voltage Vod is generated. That is, the step-down power supply circuit 112 converts the external voltage into the second power supply voltage Vod. A voltage value of the second power supply voltage Vod is a voltage having an absolute value higher than that of the first power supply voltage Vdd. In contrast, when the operation control signal Vcnt instructs to stop the step-down operation, the step-down power supply circuit 112 stops the step-down operation and puts its output in a floating state.

FIG. 1 shows an example in which the step-down power supply circuit 112 is composed of a conversion circuit that performs a step-down operation, but the present invention is not limited to this. For example, the step-down power supply circuit 112 may be a voltage conversion circuit that performs a step-up (boost) operation. When a voltage conversion circuit that performs the step-up operation is used, for example, the first power supply voltage Vdd is supplied to the voltage conversion circuit and the second power supply voltage Vod having a voltage value higher than that of the first power supply voltage Vdd is generated and the generated second power supply voltage Vod is supplied to the third power supply wiring L_od.

Further, FIG. 1 shows an example in which the step-down power supply circuit 112 is arranged in the memory bank BK, but the present invention is not limited to this. For example, one step-down power supply circuit 112 may be shared among the plurality of memory banks BK, or may be shared among the plurality of memory chips 110.

Figure 2:
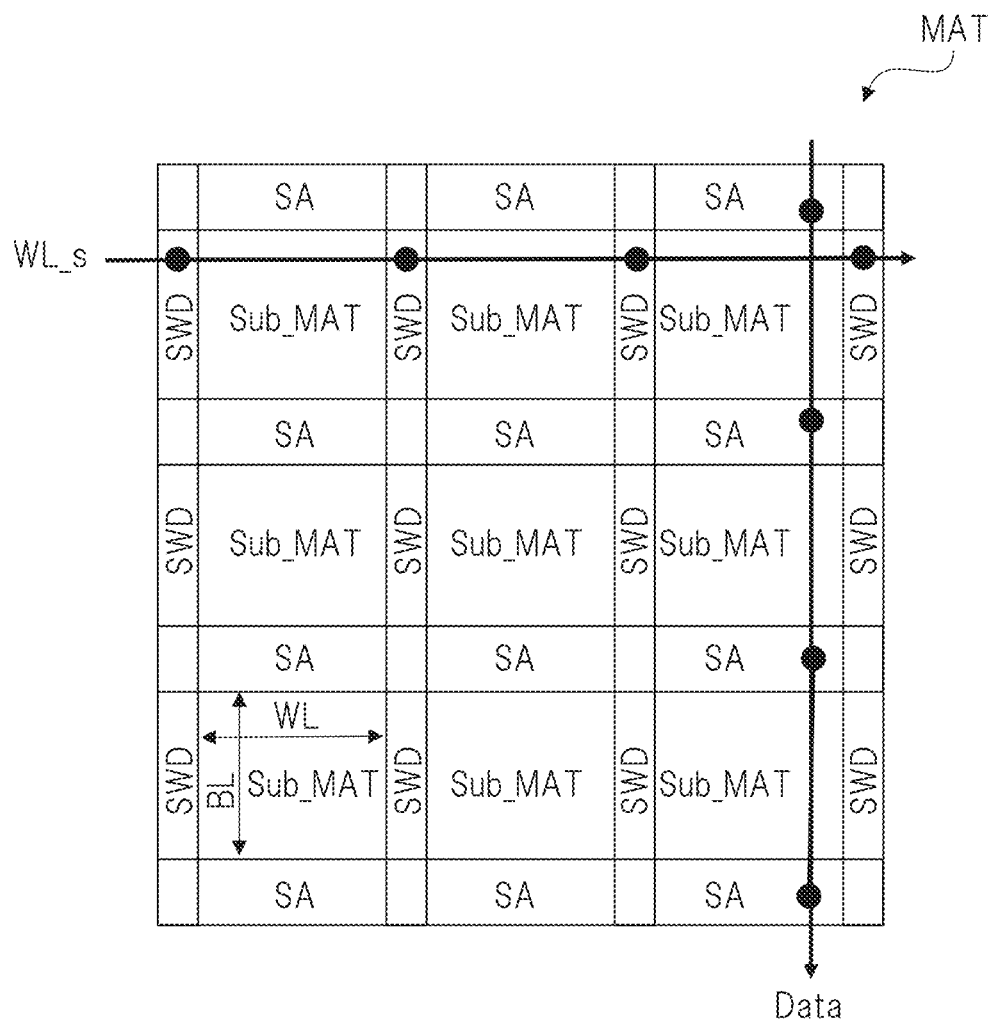
FIG. 2 is a plan view schematically showing a configuration of a memory mat according to the first embodiment.

FIG. 2 is a plan view schematically showing a configuration of the memory mat according to the first embodiment. The memory mat MAT includes: a plurality of sub-mats Sub_MAT arranged in a matrix; a plurality of sense amplifier groups SA; and a plurality of word line drivers (hereinafter, also referred to as WL drivers) SWD. Here, the sense amplifier group SA is arranged along a row of the corresponding sub-mat Sub_MAT. Also, the WL driver SWD is arranged along a column of the corresponding sub-mat Sub_MAT.

The sub-mat Sub MAT includes: a plurality of memory cells arranged in a matrix; a word line WL arranged along each row of the matrix; and a bit line BL arranged along each column of the matrix. The word line corresponds to the plurality of memory cells arranged on the row, on which the word line is arranged, and is connected to a plurality of connection memory cells corresponding thereto. Further, the bit line also corresponds to the plurality of memory cells arranged on the column, on which the bit line is arranged, and is connected to the plurality of memory cells corresponding thereto.

The WL driver SWD is supplied with a word line selection signal WL_s from a not-shown decoder and supplies it to the word line in the corresponding sub-mat Sub_MAT. Consequently, the memory cell according to an address signal supplied to the above-mentioned decoder is selected from the plurality of memory cells arranged in the sub-mat Sub_MAT. Data read from the selected memory cell to the bit line is amplified by the sense amplifier in the corresponding sense amplifier group SA via the bit line, and is outputted as read data Data.

Next, the sub-mat Sub_MAT and the corresponding sense amplifier group SA as well as the corresponding WL driver SWD will be described in detail with reference to the drawings. FIG. 3 is a circuit diagram showing configurations of the sub-mat, the sense amplifier group, and the word line driver according to the first embodiment.

Figure 3:
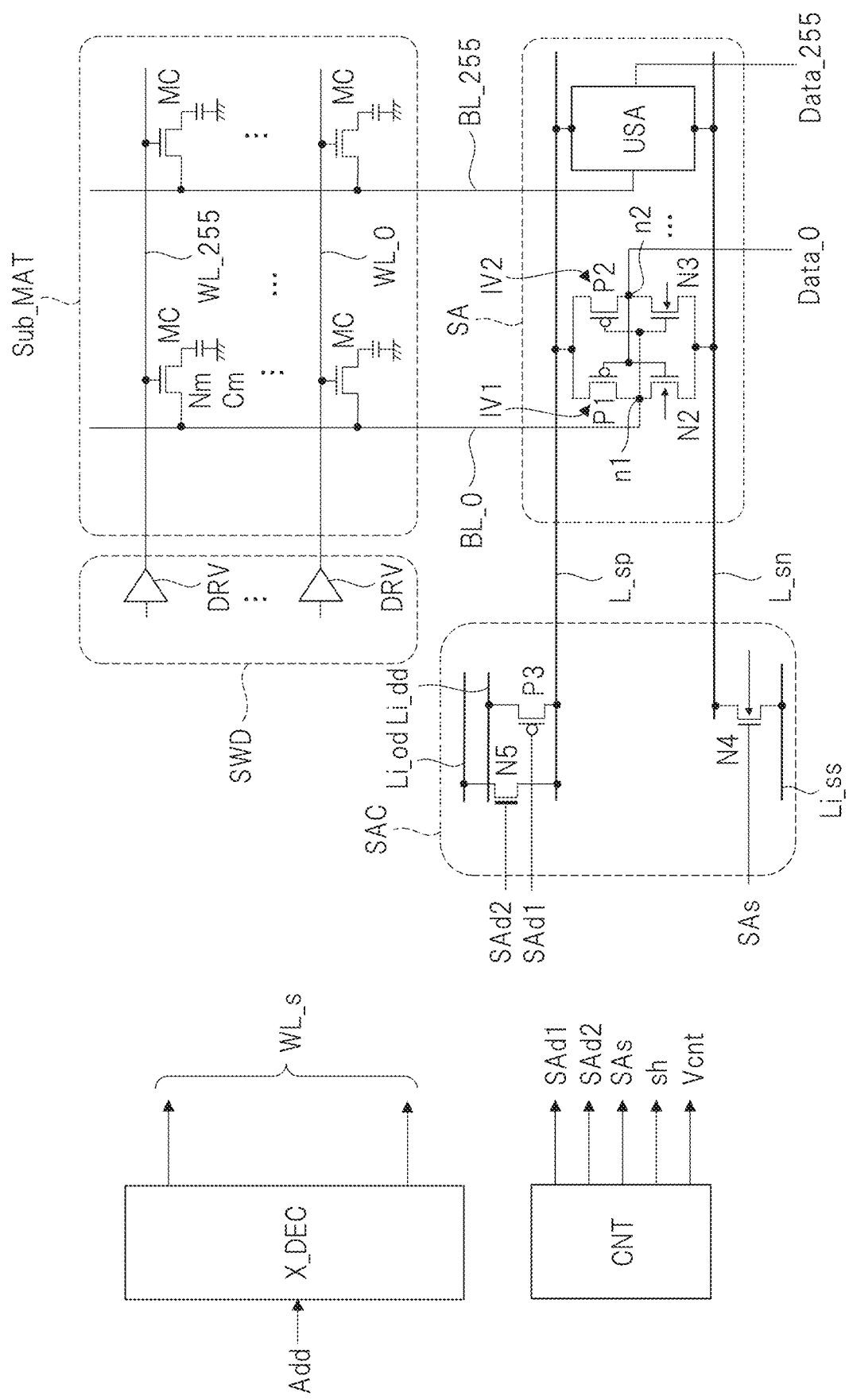
FIG. 3 is a circuit diagram showing each configuration of a sub-mat, a sense amplifier group, and a word line driver according to the first embodiment.

In FIG. 3, the reference numeral "MC" denotes memory cells arranged in a matrix on the sub-mat Sub_MAT. Further, "WL_0" to "WL_255" and "BL_0" to "BL_255" denote word lines and bit lines arranged in the sub-mat Sub_MAT. Moreover, in FIG. 3, "X_DEC" denotes the above-mentioned decoder, "CNT" denotes a control circuit, and "SAC" denotes a sense amplifier drive control circuit.

The memory cell MC includes a selection MOSFET Nm and storage capacity Cm. The storage capacity Cm is connected in series between the corresponding bit line (for example, BL_0) and the ground voltage Vss via the selection MOSFET Nm. Also, a gate of the selection MOSFET Nm is connected to the corresponding word line (eg, WL_255). Incidentally, the ground voltage Vss of the memory cell MC is supplied via the above-mentioned fourth power supply wiring Li_ss.

The WL driver SWD is equipped with a unit driver DRV connected to each word line. The decoder X_DEC decodes the address signal Add, and sets, to a high level, the word line selection signal WL_s corresponding to the word line (for example, WL_255) designated by the address signal Add among the word line selection signals WL_s and sets, to a low level, the remaining word lines. Consequently, the word line WL_255 is selected, the memory cell MC connected to the selected word line WL_255 is selected, and the selection MOSFET Nm in the selected memory cell is made an ON state. As a result, respective potentials of the bit lines BL_0 to BL_255 change according to the data (charges) stored in the storage capacity Cm in the selected memory cell MC. The respective potentials of the bit lines BL_0 to BL_255 are amplified by the sense amplifier USA in the sense amplifier group SA described below, and are outputted as read data Data (Data_0 to Data_255) from the sense amplifier group SA.

The sense amplifier group SA includes a plurality of sense amplifiers USA corresponding to bit lines BL_0 to BL_255. Here, its configuration will be described by taking the sense amplifier USA corresponding to the bit line BL_0 as an example. The sense amplifier USA includes P-channel type (hereinafter, also referred to as P-type) MOSFETs P1 and P2, and N-type MOSFETs N2 and N3, and the sense amplifier USA is connected between a sense amplifier power supply wiring L_sp and a sense amplifier ground power supply wiring L_sn. Source/drain paths of the P-type MOSFET P1 and the N-type MOSFET N2 are connected in series between the sense amplifier power supply wiring L_sp and the sense amplifier ground power supply wiring L_sn, and gates of the P-type MOSFET P1 and the N-type MOSFET N2 are mutually connected. Thus, a first inverter circuit IV1 is configured by the P-type MOSFET P1 and the N-type MOSFET N2. Similarly to the P-type MOSFET P1 and the N-type MOSFET N2, the P-type MOSFET P2 and the N-type MOSFET N3 are also connected in series between the sense amplifier power supply wiring L_sp and the sense amplifier ground power supply wiring L_sn, and their gates is also connected in common. Consequently, a second inverter circuit IV2 is configured by the P-type MOSFET P2 and the N-type MOSFET N3.

An input of the first inverter circuit IV1 is connected to an output node n2 of the second inverter circuit IV2, and an input of the second inverter circuit IV2 is connected to an output node n1 of the first inverter circuit IV1. That is, the first inverter circuit IV1 and the second inverter circuit IV2 are cross-connected. The corresponding bit line BL_0 is connected to the output node n1 of the first inverter circuit IV1, and the read data Data_0 is outputted from the output node of the second inverter circuit IV2. Since they are cross-connected, the output nodes n1 and n2 can be regarded as input/output nodes.

The sense amplifier drive control circuit SAC includes a switch P-type MOSFET P3 (first switch) and switch N-type MOSFETs N4 and N5 (second switch), and is connected to the fourth power supply wiring Li_ss, the fifth power supply wiring (first power supply wiring) Li_dd, the sixth power supply wiring Li_od, the sense amplifier power supply wiring L_sp, and the sense amplifier ground power supply wiring L_sn that are arranged in the memory mat MAT. The N-type MOSFET N5 has, for example, a size larger than that of the N-type MOSFET N2 so that its drive capability is higher than that of the N-type MOSFET N2. Incidentally, in this specification, the gate of the large-sized MOSFET is clearly illustrated by a thick line.

As shown in FIG. 3, source/drain paths of the P-type MOSFET P3 are connected between the fifth power supply wiring Li_dd and the sense amplifier power supply wiring L_sp, and source/drain paths of the N-type MOSFET N5 are connected between the sixth power supply wiring Li_od and the sense amplifier power supply wiring L_sp. Further, source/drain paths of the N-type MOSFET N4 are connected between the fourth power supply wiring Li_ss and the sense amplifier ground power supply wiring L_sn.

Sense amplifier control signals SAd1, SAs and SAd2 outputted from the control circuit CNT are supplied to the gates of the P-type MOSFET P3 and the N-type MOSFETs N4 and N5. That is, each on/off of the switch P-type MOSFET P3 and the switch N-type MOSFETs N4 and N5 is controlled by the sense amplifier control signal from the control circuit CNT. When the switch MOSFET becomes an ON state by the sense amplifier control signal, the ground voltage Vss is supplied to the sense amplifier ground power supply wiring L_sn and the first power supply voltage Vdd or second power supply voltage Vod is supplied to the sense amplifier power supply wiring L_sp. Consequently, the first inverter circuit IV1 and the second inverter circuit IV2, which are cross-connected, operate, and performs a positive feedback operation that amplifies a potential of the bit line BL.

The control circuit CNT outputs a short control signal Sh and an operation control signal Vcnt that control the N-type MOSFET N1 configuring the short switch SHT shown in FIG. 1. Incidentally, in FIG. 3, the control circuit CNT is drawn as if it is provided in the memory mat MAT, but the present invention is not limited to this. For example, the control circuit CNT may be provided outside the memory mat MAT.

<Operation of Semiconductor Device>

Next, an operation of the memory chip 110 will be described with reference to the drawings. FIG. 4 is a diagram for explaining an operation of the memory chip according to the first embodiment. Here, FIG. 4A shows a circuit diagram of a portion related to the sense amplifier drive control circuit SAC (FIG. 3), and FIG. 4B shows a waveform diagram of a read operation of the memory cell MC.

As shown in FIGS. 2 and 3, the memory mat MAT includes the plurality of sub-mats Sub_MAT, the plurality of sense amplifier groups SA, and the like. But, in order to facilitate explanation, FIG. 4 shows only one sense amplifier USA, the sense amplifier power supply wiring L_sp, the power supply wirings L_od, L_dd, Li_od and Li_dd, and one short switch SHT. As described above, the fifth power supply wiring Li_dd and the sixth power supply wiring Li_od are power supply wirings arranged in the memory mat MAT, and the second power supply wiring L_dd and the third power supply wiring L_od are arranged power supply wirings outside the memory mat MAT. Since the sense amplifier group SA is arranged in the memory mat MAT, the sense amplifier power supply wiring L_sp is, of course, a power supply wiring arranged in the memory mat MAT.

Figure 4A:
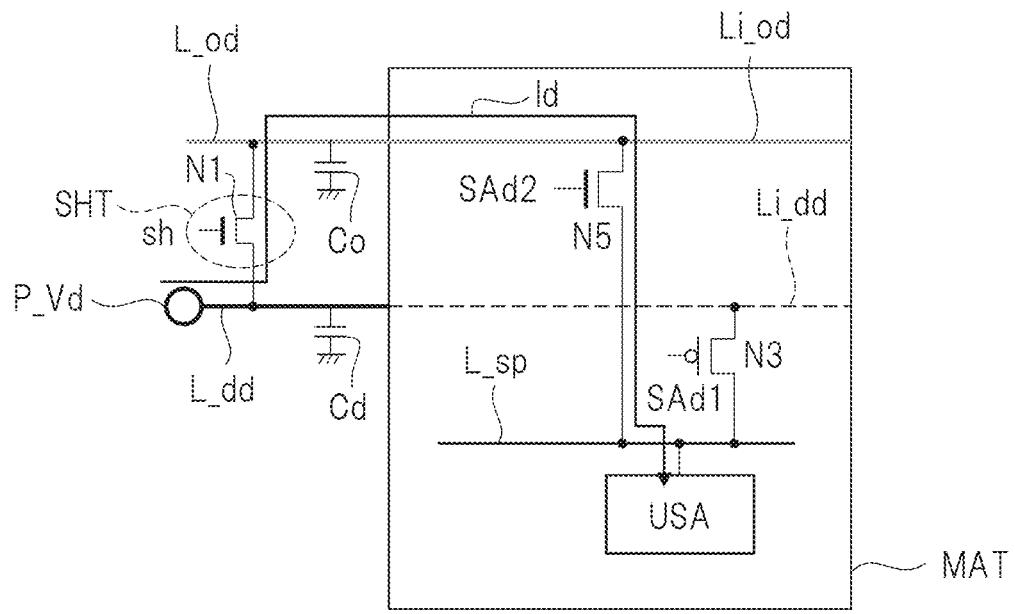
FIG. 4A is a diagram for explaining an operation of a memory chip according to the first embodiment.
Figure 4B:
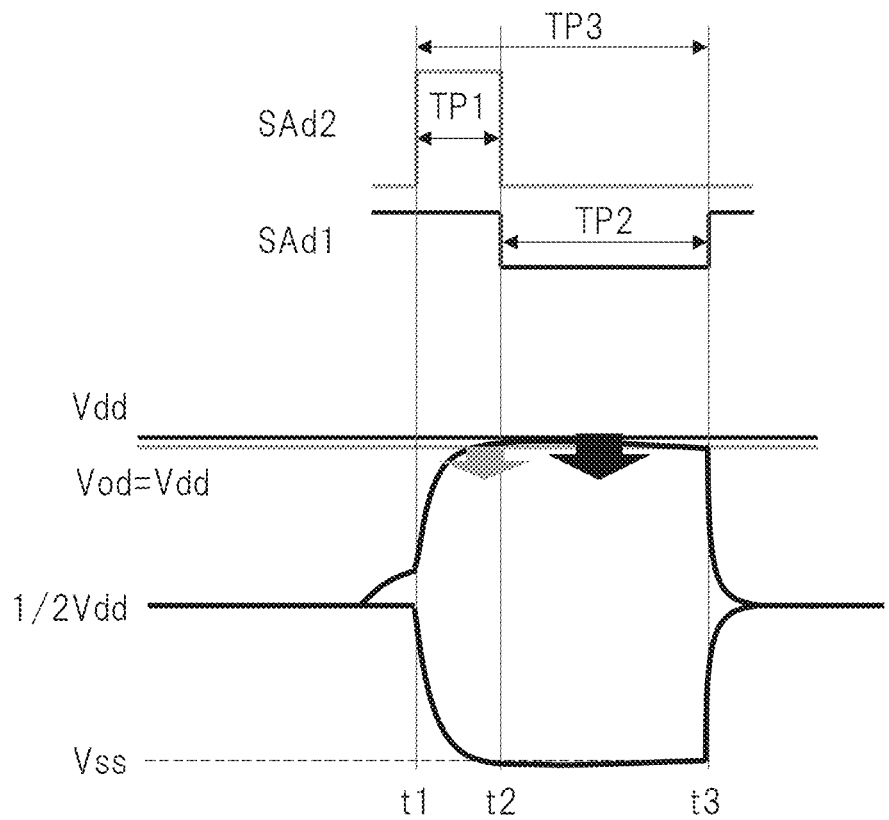
FIG. 4B is a diagram for explaining an operation of a memory chip according to the first embodiment.

As shown in FIG. 4A, the sixth power supply wiring Li_od and the fifth power supply wiring Li_dd arranged in the memory mat MAT are electrically connected to the corresponding third power supply wiring L_od and the corresponding second power supply wiring L_dd arranged outside the memory mat MAT.

In the first embodiment, when speed of elements (MOSFET etc.) becomes low (hereinafter, also referred to as a low-speed state) due to process variations and when it is below the low speed (Tpy and Fast) (hereinafter, also referred to as a normal state), a state of the shoot switch SHT and an operation of the step-down power supply circuit 112 (FIG. 1) are changed. That is, the state of the shoot switch SHT and the operation of the step-down power supply circuit 112 are selectively changed according to magnitude of an operation margin of the sense amplifier USA. For example, the operation margin when the operation of the sense amplifier USA becomes unstable is used as a reference, and when the operation margin is smaller than this reference, it corresponds to the low-speed state and when the operation margin is larger than the reference, it corresponds to the normal state.

In the low-speed state, that is, when the operation margin is small, the control circuit CNT (FIG. 3) instructs the step-down power supply circuit 112 to perform the step-down operation by the operation control signal Vcnt. At this time, the control circuit CNT makes the short switch SHT an OFF state by the short control signal Sh. In contrast, in the normal state, that is, when the operation margin is large (when the operation margin is not small), the control circuit CNT instructs the step-down power supply circuit 112 to stop the step-down operation by the operation control signal Vcnt. At this time, the control circuit CNT makes the short switch SHT an ON state by the short control signal Sh.

Next, the read operations in the normal state and the low-speed state will be described.

<<Common Operation for Reading>>

Here, a case where data is read from the memory cell MC connected to an intersected portion of the word line WL_0 and the bit line BL_0 shown in FIG. 3 will be described as a typical example.

At a time of reading, the bit line BL_0 is pre-charged to an intermediate potential (½Vdd) between the ground voltage Vss and the first power supply voltage Vdd. After the bit line BL_0 is pre-charged, the word line WL_0 changes to a high level and the word line WL_0 is selected. Consequently, the selection MOSFET Nm in the memory cell MC (memory cell MC at the intersected portion) connected to the word line WL_0 and the bit line BL_0 becomes the ON state, and a potential of the bit line BL_0 changes from ½Vdd according to charges accumulated in the storage capacity Cm. That is, as shown in FIG. 4B, the potential of the bit line BL_0 changes from ½Vdd before time t1.

<<Low-Speed State>>

In the low-speed state, the control circuit CNT makes the short switch SHT the OFF state, and causes the step-down power supply circuit 112 to perform the step-down operation. Since the step-down operation is performed, the step-down power supply circuit 112 outputs, to the third power supply wiring L_od, the second power supply voltage Vod having a voltage value higher than that of the first power supply voltage Vdd. This results in overdrive.

Further, as shown in FIG. 4B, the control circuit CNT makes the sense amplifier control signal SAd1 a high level in an initial period TP1 from the time t1 to time t2, and makes the sense amplifier control signal SAd2 a low level in a period TP2 from the time t2 to time t3. Incidentally, although being not shown in FIG. 4B, the control circuit CNT makes the sense amplifier control signal SAs a high level during a composite period (period TP3) of the initial period TP1 and the period TP2.

Thus, in the initial period TP1, the N-type MOSFETs N4 and N5 shown in FIG. 3 are in the ON states, and the P-type MOSFET P3 shown in FIG. 3 is in the OFF state. Further, in the period TP2, the N-type MOSFET N4 and the P-type MOSFET P3 are in the ON states, and the N-type MOSFET N5 is in the OFF state.

As a result, in the initial period TP1, the sense amplifier USA is connected to the sixth power supply wiring Li_od and the third power supply wiring L_od via the sense amplifier power supply wiring L_sp and the N-type MOSFET N5. In contrast, in the period TP2, the sense amplifier USA is connected to the fifth power supply wiring Li_dd and the second power supply wiring L_dd via the sense amplifier power supply wiring L_sp and the P-type MOSFET N3. Thus, the potential of the bit line BL_0 is amplified by the sense amplifier USA and is outputted as data Data_0. Incidentally, although being not shown in FIG. 4B, during the period T3 (T1+T2) the sense amplifier USA is connected to a ground power supply wiring outside the fourth power supply wiring Li_ss and the memory mat via the sense amplifier ground power supply wiring L_sn and the N-type MOSFET N4 and the ground voltage Vss is supplied to the sense amplifier USA.

In the initial period TP1, a large drive current Id (FIG. 4A) is supplied to the sense amplifier USA via the large-sized N-type MOSFET N5 and, in the period TP2 following the initial period TP1, the overdrive is realized by suppling a relatively small drive current via the small-sized P-type MOSFET P3.

<<<Normal State>>>

In the normal state, the control circuit CNT makes the short switch SHT an ON state, and stops the step-down power supply circuit 112. Since the step-down power supply circuit 112 is stopped, the overdrive is not performed. Although being not particularly limited, the control circuit CNT makes the short switch SH an ON state by the short control signal Sh during a period in which the N-type MOSFET N5 and the P-type MOSFET P3 are in the ON states (initial period TP1 and period TP2).

Since the short switch SHT is in the ON state, the third power supply wiring L_od and the second power supply wiring L_dd are connected outside the memory mat MAT. That is, respective parasitic capacitances Co and Cd are synthesized. In the initial period TP1, a drive current Id (FIG. 4A) is supplied to the sense amplifier USA from the third power supply wiring L_od and the second power supply wiring L_dd via the large-sized N-type MOSFET N5. At this time, since the parasitic capacitance added to the power supply wiring is a composite capacitance of the parasitic capacitances Co and Cd, fluctuation of the first power supply voltage Vdd supplied to the sense amplifier USA is suppressed even if the large drive current Id flows therein, so that the sense amplifier USA can be operated stably.

In the period TP2 following the initial period TP1, the P-type MOSFET P3 becomes the ON state, the drive current is supplied to the sense amplifier USA via the P-type MOSFET P3, and the potential of the bit line is amplified by the sense amplifier USA and is outputted as data Data_0. Since the short switch SHT is in the ON state also during the period TP2, the operation of the sense amplifier USA can be prevented from becoming unstable even if the large drive current Id flows via the P-type MOSFET P3 during this period TP2.

Since the step-down power supply circuit 112 is stopped in the normal state, power consumption can be reduced. Incidentally, since the step-down power supply circuit 112 is stopped and the short switch SHT is in the ON state, the second power supply voltage Vod becomes substantially equal to the first power supply voltage Vdd as shown in FIG. 4B.

The example of making the short switch SHT the ON state during the initial period TP1 and the period TP2 has been described, but the present invention is not limited to this. For example, in the period TP2, the short switch SHT may be made the OFF state. Even in this case, the operation of the sense amplifier USA can be prevented from becoming unstable due to the large drive current Id in the initial period TP1.

Figure 11:
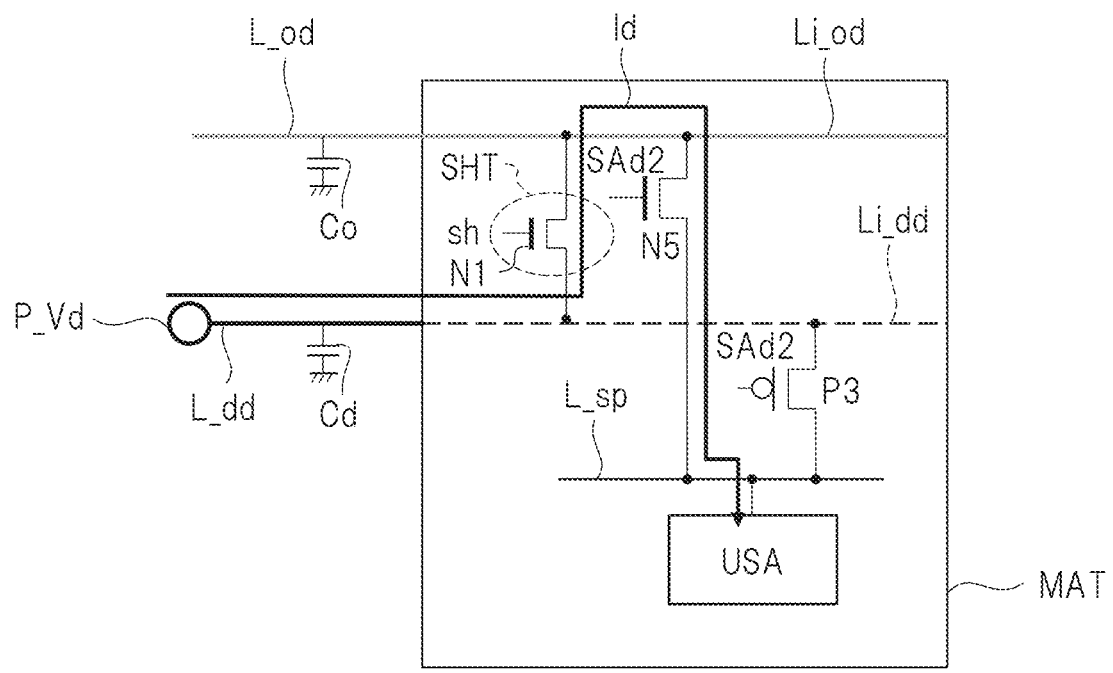
FIG. 11 is a circuit diagram for explaining an arrangement of the short switch according to the first embodiment.
Figure 12:
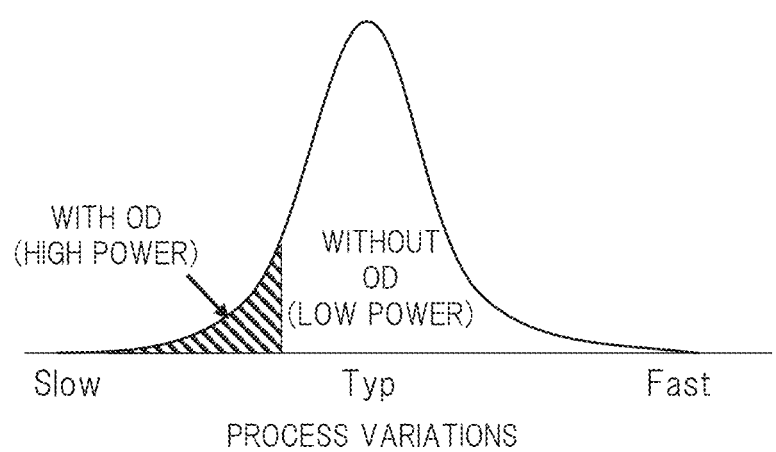
FIG. 12 is a view showing variations in process of a semiconductor device.

It is conceivable that the short switch SHT is arranged not outside the memory mat MAT but inside the memory mat MAT. However, it is appropriate to arrange the short switch SHT outside the memory mat MAT. FIG. 11 is a circuit diagram for explaining an arrangement of the short switch according to the first embodiment. FIG. 11 is similar to FIG. 4A. A difference therebetween is that, in FIG. 11, the short switch SHT is arranged in the memory mat MAT. In an arrangement of FIG. 11, the sixth power supply wiring Li_od and the fifth power supply wiring Li_dd are connected in the memory mat MAT. Consequently, in the normal state, the parasitic capacitance Co of the third power supply wiring L_od does not act to suppress the fluctuation of the first power supply voltage Vdd. Therefore, this is not suitable for stabilizing the operation of the sense amplifier USA under the normal state. Further, when line width etc. of the fifth power supply wiring Li_dd are narrower than that of the second power supply wiring L_dd and unit resistance of the fifth power supply wiring Li_dd is higher than that of the second power supply wiring L_dd, an amount of the drive current Id consumed by resistance of the fifth power supply wiring Li_dd increases, which leads to an increase in power consumption.

Whether the speed of the element becomes low due to the process variations is determined, for example, when characteristics of the stacked memory 100 or the memory chip 110 are measured. According to a measurement result(s), for example, a fuse in a control region FCT shown in FIG. 10B is fused and cut. That is, the low-speed state or the normal state is represented by a state of the fuse. The control circuit CNT shown in FIG. 3 generates sense amplifier control signals SAd1, SAd2, a short control signal Sh, an operation control signal Vcnt, and the like based on the state of the fuse. A place where the control circuit CNT is arranged is not particularly limited, but the control circuit CNT is arranged in, for example, the same control area FCT as that of the fuse.

Second Embodiment

Figure 5A:
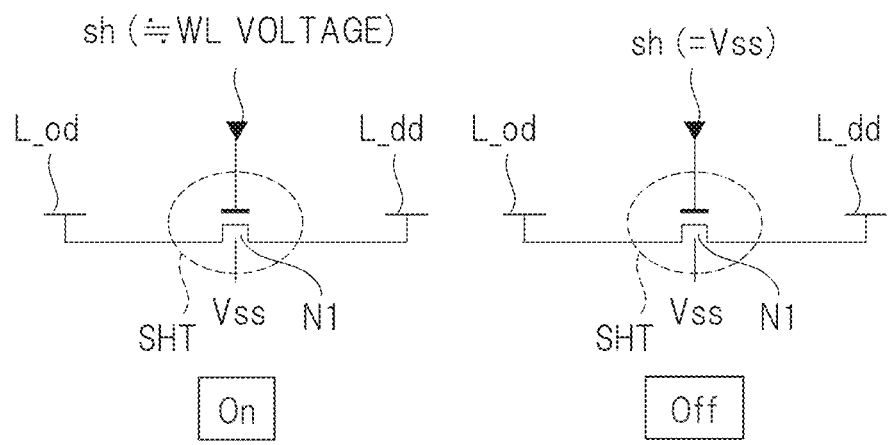
FIG. 5A is a diagram for explaining a short switch according to a second embodiment.
Figure 5B:
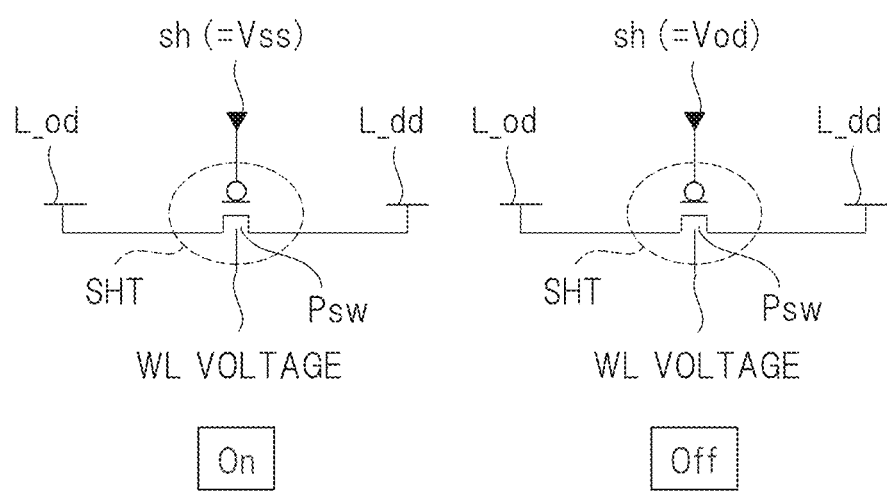
FIG. 5B is a diagram for explaining a short switch according to the second embodiment.

FIG. 5 is a diagram for explaining a short switch according to a second embodiment. Here, FIG. 5A shows a case where the short switch SHT is configured by an N-type MOSFET, and FIG. 5B shows a case where the short switch SHT is configured by a P-type MOSFET.

One electrode (source electrode) of the N-type MOSFET N1 is connected to the second power supply wiring L_dd, and the other electrode (drain electrode) thereof is connected to the third power supply wiring L_od. Further, a ground voltage Vss is supplied to a back gate electrode. When the short switch SHT is made an ON state (On), a high-level voltage (WL voltage) supplied to the word line WL in selecting the word line is supplied as the short control signal Sh.

The first power supply voltage Vdd is, for example, about 1.0 (V), and the second power supply voltage Vod is, for example, about 1.2 (V). In selecting the memory cell MC, a relatively high voltage value, for example, a WL voltage of about 3.0 (V), is supplied as a word line selection signal WL_s in order to reduce a voltage drop due to a threshold voltage of a selection MOSFET Nm. In a configuration shown in FIG. 5A, when the N-type MOSFET N1 is made the ON state, a relatively high voltage value is supplied to the gate, so that a voltage drop due to a threshold voltage of the N-type MOSFET N1 is reduced and a potential difference between the second power supply wiring L_dd and the third power supply wiring L_od can be reduced.

When the short switch SHT is made the OFF state, the short control signal Sh of the ground voltage Vss is supplied to the gate of the N-type MOSFET N1.

In FIG. 5B, the short switch SHT is configured by a P-type MOSFET Psw. The above-mentioned WL voltage is supplied to a back gate electrode of the P-type MOSFET Psw. When the short switch SHT is made the ON state, a voltage value lower than the first power supply voltage Vdd, for example, the ground voltage Vss, is supplied as a short control signal Sh to the gate of the P-type MOSFET Psw. In contrast, when the short switch SHT is made the OFF state, the second power supply voltage Vod is supplied as a short control signal Sh to the gate of the P-type MOSFET Psw.

Also in the second embodiment, each short switch can be configured by one MOSFET, which makes it possible to suppress an increase in a occupied area. Further, since the WL voltage supplied to the selected word line can be diverted, a dedicated power supply for the short switch is unnecessary.

Third Embodiment

FIG. 6 is a diagram for explaining an operation of a sense amplifier according to a third embodiment. Here, FIG. 6A shows a configuration of a memory mat MAT. FIG. 6A is similar to FIG. 4A, for example. A main difference therebetween is that a ground power supply wiring L_sn and an N-type MOSFET N4, which have been omitted in FIG. 4A, are clearly shown in FIG. 6A, the N-type MOSFET N4 suppling the ground voltage Vss to the sense amplifier USA.

In the third embodiment, the N-type MOSFET N5 connected between the sense amplifier power supply wiring L_sp and the sixth power supply wiring Li_od, and the P-type MOSFET P3 connected between the sense amplifier power supply wiring L_sp and the fifth power supply wiring Li_dd are temporally controlled so as to become the ON states by overlapping (overlapping) with at least a part of them. Consequently, when a potential of the bit line is amplified by the sense amplifier USA, a drive current that can be supplied to the sense amplifier USA can be increased and the operation margin of the sense amplifier USA can be further increased.

Specifically, in FIG. 6B, the control circuit CNT outputs such sense amplifier control signals SAd1 and SAd2 that a high-level period (TP1) of the sense amplifier control signal SAd2 partially overlaps with a low-level period (TP2) of the sense amplifier control signal SAd1. Consequently, the initial period TP1 becomes an overlap period Tov, and current driving ability in this period can be enhanced.

Further, in FIG. 6C, the control circuit CNT outputs such sense amplifier control signals SAd1 and SAd2 that the high-level period (TP1) of the sense amplifier control signal SAd2 coincides with the low-level period (TP2) of the sense amplifier control signal SAd1. Consequently, the current driving ability can be enhanced in the overlap period Tov.

Fourth Embodiment

In a fourth embodiment, an area for performing control about whether to perform overdrive is subdivided. The overdriving makes it possible to increase the operation margin of the sense amplifier USA, but this leads to an increase in power consumption. Therefore, the increase in power consumption can be further suppressed as the area for the overdriving is reduced.

FIG. 7 is a diagram for explaining a semiconductor device according to a fourth embodiment. Here, FIG. 7A shows a configuration of a stacked memory 100, FIG. 7B shows a configuration of a memory chip 110, and FIG. 7C shows a configuration of a memory bank BK.

FIG. 7A is similar to FIG. 10A. A difference therebetween is that whether to perform the overdrive is determined in units of memory chip. That is, the control circuit CNT shown in FIG. 3 performs the control in units of memory chip. In FIG. 7A, the control circuit CNT controls the memory chip 110_4 so as to overdrive, and controls the remaining memory chips in a normal state so as not to overdrive. The configuration of FIG. 7A makes it possible to overdrive only a memory chip having a reduction in operation margin caused by process variations in manufacturing the memory chip, which makes it possible to suppress an increase in the power consumption in units of memory chip.

FIG. 7B is similar to FIG. 10B. A difference therebetween is that whether to perform overdrive is determined in units of memory bank. That is, the control circuit CNT shown in FIG. 3 performs the control in units of memory bank. In FIG. 7B, the control circuit CNT controls two memory banks among sixty-four (64) memory banks included in the memory chip 110_4 so as to perform overdrive, and controls the remaining memory bank in the normal state so as not to overdrive. The configuration of FIG. 7B makes it possible to overdrive, for example, only the memory bank having a reduction in operation margin caused by variations in the power supply voltage in the memory chip 110_4, which makes it possible to suppress the increase in power consumption in units of memory bank.

FIG. 7C is a plan view schematically showing a configuration of a memory bank BK12. In the figure, the reference numeral "PH" denotes a peripheral circuit. In FIG. 7C, the memory bank BK12 includes eight memory mats MAT. The control circuit CNT performs control in units of memory mat. In FIG. 7C, the control circuit CNT controls one of the eight memory mats MAT so as to overdrive, and controls the remaining memory mats in the normal state so as not to overdrive. The configuration of FIG. 7C makes it possible to overdrive, for example, only the memory mat having a reduction in operation margin caused by variations in the elements, which makes it possible to suppress an increase in power consumption in units of memory mat.

The control circuit CNT according to the fourth embodiment is not particularly limited, but is provided in units of target to be controlled. For example, in the case of FIG. 7A, the control circuit CNT is provided in units of one hundred memory chips; in the case of FIG. 7B, it is provided in units of memory bank BK; and in the case of FIG. 7C, it is provided in units of memory mat MAT. Of course, the present invention is not limited to this, and a common control circuit CNT may be provided.

The typical embodiments have been described with reference to the drawings, but the followings can be adopted as other embodiments.

A. The control circuit CNT (FIG. 3) dynamically switches presence or absence of the overdrive by detecting temperature, a voltage drop, and an operation status (parallel continuous operation, operation frequency, and high-speed/low-speed mode switching, etc.). In this case, the power consumption can be suppressed when the power consumption increases not only in the memory chip but also in the entire system (temperature rise etc.).

B. Not only the switching of the presence or absence of the overdrive but also other control can be performed.

B1. For example, added is such a power reduction control mode as to further reduce the power consumption. In this case, in the power reduction control mode, an OD N-type MOSFET N5 (FIG. 3) is made the OFF state by an OD control signal (sense amplifier control signal SAd2). This power reduction control mode is set to be executed in performing a low-speed operation such as a refresh operation.

B2. In overdriving, added is such a control mode that an overdrive second power supply voltage Vod is always applied not only in the initial period (TP1: FIG. 4B) for causing the sense amplifier USA to operate but also in a period (TP3) for activating the sense amplifier USA. This makes it possible to increase the operation margin of the sense amplifier USA even outside the initial period, which makes it possible to improve a write voltage to and a read margin from the memory cell. In this case, by using it together with a redundant relief function, further improvement of a yield can be achieved.

B3. Alternatively, the operation mode may be switched by changing the first power supply voltage Vdd. When the first power supply voltage Vdd is shared as a power supply voltage of another circuit, the operation mode can be adapted to the change of the shared first power supply voltage Vdd.

C. In the first embodiment, the second power supply voltage Vod has been generated by forming, through the step-down circuit, the external power supply voltage from outside. However, the second power supply voltage Vod may be generated by stepping up the external power supply voltage through the step-up circuit. In addition, both the first power supply voltage Vdd and the second power supply voltage Vod may be generated by stepping down or up the external power supply voltage. Further, the second power supply voltage Vod may be generated by using the external power supply voltage, and the first power supply voltage Vdd may be generated by stepping down the external power supply voltage.

D. The stacked memory may be used as a common memory chip for various products having different power supply voltages of the base chip 120 (FIG. 10).

According to the embodiment, the power consumption can be reduced while the sense amplifier is operated at a low voltage and the high-speed operation is maintained. That is, even when the overdrive is not performed, the sense amplifier can be operated stably, and even if process variations and device variations are caused, a decrease in yield can be suppressed.

Further, in the semiconductor device according to the embodiment, the overdrive is performed in the low-speed state. In the low-speed state, a current such as a leakage current flowing through the MOSFET decreases. Therefore, even if the overdrive is performed in the low-speed state, an increase in power consumption can be suppressed as the entire semiconductor device.

In addition, since the present embodiment can be realized by a change of the control circuit CNT and addition of the short switch, etc., this also makes it possible to suppress an increase in the occupied area.

As described above, although the invention made by the present inventors has been specifically described based on the embodiments, the present invention is not limited to the above embodiments and, needless to say, can be variously modified without departing from the gist thereof. For example, in the embodiment, the dynamic type memory has been described, but the present invention is not limited to this and may be a static type memory or the like.

What is claimed is:

1. A semiconductor device comprising:
    a memory mat including:
        a plurality of memory cells;
        a sense amplifier connected to at least one memory cell selected from the plurality of memory cells;
        a first switch connected to the sense amplifier via a sense amplifier ground power supply wiring and made an ON state when the sense amplifier is operated; and
        a second switch connected to the sense amplifier via a sense amplifier power supply wiring and made an ON state when the sense amplifier is operated;
    a first power supply wiring arranged outside the memory mat for supplying a ground voltage to the memory mat;
    a second power supply wiring arranged outside the memory mat for supplying a first power supply voltage to the memory;
    a third power supply wiring arranged outside the memory mat for supplying a second power supply voltage to the memory mat, the second power supply voltage being higher than the first power supply voltage; and
    a third switch arranged outside the memory mat and connected between the second power supply wiring and the third power supply wiring,
    wherein the third switch is made an ON state when the sense amplifier is operated,
    wherein the memory mat further comprises:
        a fourth switch connected to the sense amplifier via the sense amplifier power supply wiring and made an ON state when the sense amplifier is operated;
        a fourth power supply wiring connect to the first switch;
        a fifth power supply connected to the fourth switch; and
        a sixth power supply wiring connect to the second switch,
    wherein the first power supply wiring is connect to the fourth power supply wiring,
    wherein the second power supply wiring is connected to the fifth power wiring,
    wherein the third power supply wiring is connected to the sixth power supply wiring, and
    wherein the third switch is made an OFF state when an operation margin of the sense amplifier is small, and the third switch is made the ON state when the operation margin is not small.

2. The semiconductor device according to claim 1, wherein a voltage conversion circuit is connected to the third power supply wiring, and the voltage conversion circuit converts a predetermined voltage into the second power supply voltage when the operation margin is small, the voltage conversion circuit supplying it to the third power supply wiring.

3. The semiconductor device according to claim 2, wherein an operation of the voltage conversion circuit is stopped when the third switch is made the ON state.

4. The semiconductor device according to claim 3, wherein the first switch, the second switch, the third switch, and the fourth switch are each configured by a MOSFET.

5. The semiconductor device according to claim 1, wherein the second switch becomes the ON state in an initial period before the first switch becomes the ON state.

6. The semiconductor device according to claim 1, wherein a period in which the fourth switch becomes the ON state and a period in which the second switch becomes the ON state partially overlap.

7. The semiconductor device according to claim 1, further comprising a plurality of memory chips each having a plurality of memory mats composed of the memory mat, wherein the third switch is made the ON state in at least a predetermined memory chip among the plurality of memory chips.

8. The semiconductor device according to claim 1, further comprising a plurality of memory banks each having a plurality of memory mats composed of the memory mat, wherein the third switch is made the ON state in at least a predetermined memory bank among the plurality of memory banks.

9. The semiconductor device according to claim 1, further comprising a plurality of memory mats composed of the memory mat,
wherein the third switch is made the ON state in at least a predetermined memory mat among the plurality of memory mats.

* * * * *